(12) United States Patent
Takemoto

(10) Patent No.: US 7,968,997 B2
(45) Date of Patent: Jun. 28, 2011

(54) SEMICONDUCTOR DEVICE

(75) Inventor: Yasuo Takemoto, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/361,083

(22) Filed: Jan. 28, 2009

(65) Prior Publication Data

US 2009/0189158 A1 Jul. 30, 2009

(30) Foreign Application Priority Data

Jan. 30, 2008 (JP) ................................ P2008-019005

(51) Int. Cl.
*H01L 23/48* (2006.01)
*H01L 23/52* (2006.01)
*H01L 23/02* (2006.01)
*H01L 29/40* (2006.01)

(52) U.S. Cl. ... 257/692; 257/690; 257/678; 257/E23.07; 257/786

(58) Field of Classification Search .................. 257/676, 257/678, 686, 777, 780, 786, 690, 692, E23.07; 361/772, 777, 743
See application file for complete search history.

(56) References Cited

U.S. PATENT DOCUMENTS

| | | | | | |
|---|---|---|---|---|---|
| 3,398,232 | A | * | 8/1968 | Hoffman | 174/254 |
| 3,838,317 | A | * | 9/1974 | Coyne | 439/49 |
| 4,942,453 | A | * | 7/1990 | Ishida et al. | 257/692 |
| 6,400,019 | B1 | | 6/2002 | Hirashima et al. | |
| 6,476,500 | B2 | * | 11/2002 | Kimura | 257/777 |
| 6,515,355 | B1 | * | 2/2003 | Jiang et al. | 257/678 |
| 6,720,666 | B2 | * | 4/2004 | Lim et al. | 257/786 |
| 6,787,924 | B2 | | 9/2004 | Tsunemasu | |
| 6,927,491 | B1 | | 8/2005 | Yamada | |
| 6,940,176 | B2 | | 9/2005 | Chen | |
| 7,132,752 | B2 | * | 11/2006 | Saeki | 257/777 |
| 7,132,753 | B1 | * | 11/2006 | St. Amand et al. | 257/777 |
| 7,199,478 | B2 | * | 4/2007 | Jung | 257/786 |
| 7,477,523 | B2 | * | 1/2009 | Tsuji | 361/760 |
| 2004/0067606 | A1 | * | 4/2004 | Fehr et al. | 438/109 |
| 2006/0172566 | A1 | * | 8/2006 | Nakajima et al. | 439/67 |
| 2006/0249829 | A1 | * | 11/2006 | Katagiri et al. | 257/686 |
| 2007/0045864 | A1 | * | 3/2007 | Shiba et al. | 257/777 |
| 2007/0075414 | A1 | * | 4/2007 | Tsutsumi et al. | 257/692 |
| 2007/0117266 | A1 | * | 5/2007 | Ball | 438/108 |
| 2008/0135728 | A1 | * | 6/2008 | Yang et al. | 250/208.1 |
| 2009/0045525 | A1 | * | 2/2009 | Matsushima et al. | 257/777 |
| 2009/0085223 | A1 | * | 4/2009 | Nishiyama et al. | 257/777 |

FOREIGN PATENT DOCUMENTS

| | | |
|---|---|---|
| GB | 2 344 463 A | 6/2000 |
| JP | 2000-82757 | 3/2000 |
| JP | 2001-177266 | 6/2001 |
| JP | 2002-57242 | 2/2002 |
| JP | 2003-332497 | 11/2003 |
| JP | 2006-294656 | 10/2006 |

* cited by examiner

*Primary Examiner* — Teresa M Arroyo

(74) *Attorney, Agent, or Firm* — Oblon, Spivak, McClelland, Maier & Neustadt, L.L.P.

(57) ABSTRACT

A semiconductor device includes a wring board having a first surface with external connection terminals and a second surface with internal connection terminals. On the second surface of the wiring board, a semiconductor chip having electrode pads is mounted. The electrode pads of the semiconductor chip and the internal connection terminals of the wiring board are electrically connected via connecting members. The external connection terminals are arranged along two opposite outer sides of the wiring board and each have a rectangular shape elongated in a direction toward the outer side.

17 Claims, 7 Drawing Sheets

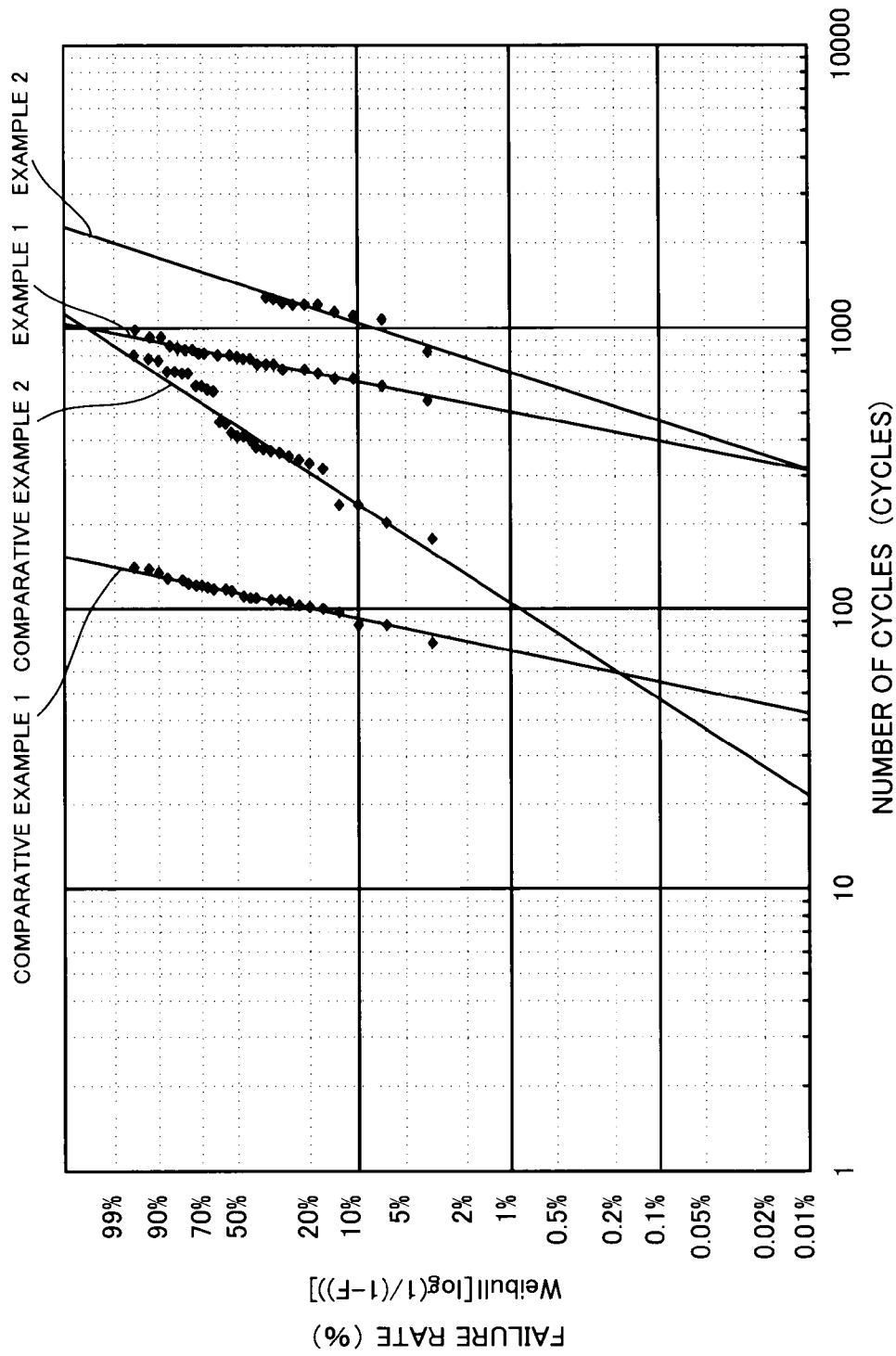

SEMICONDUCTOR DEVICE

CROSS-REFERENCE TO RELATED APPLICATIONS

This application is based upon and claims the benefit of priority from the prior Japanese Patent Application No. 2008-019005, filed on Jan. 30, 2008; the entire contents of which are incorporated herein by reference.

BACKGROUND OF THE INVENTION

As typical structures of a semiconductor package (semiconductor device), there have been known a package structure using a lead frame as a circuit base on which semiconductor chips are mounted (TSOP (Thin Small Outline Package) and the like) and a package structure using a wiring board as a circuit base (BGA (Ball Grid Array) and LGA (Land Grid Array)). A semiconductor package such as TSOP contributes to cost reduction of the semiconductor package since it uses an inexpensive lead frame as the circuit base.

TSOP has a resin-sealed body in which semiconductor chips mounted on the lead frame are resin-sealed and outer leads projecting from side surfaces of the resin-sealed body. The size of the resin-sealed body enclosing the semiconductor chips is smaller than the package size of TSOP. Therefore, the size of the semiconductor chips is unavoidably smaller than the package size. When the semiconductor package is mounted on a mounting board, an actual shape of the semiconductor chips becomes smaller than an area occupied by the semiconductor package on the mounting board. In a semiconductor package having semiconductor memory chips such as NAND flash memories, it is not possible to obtain a memory capacity corresponding to the package size.

A semiconductor package such as BGA or LGA can have larger semiconductor chips packaged therein than TSOP since the size of its resin-sealed body and its package size are equal. However, a mounting board for TSOP (printed circuit board or the like) is not usable as it is for BGA and LGA since in typical BGA and LGA, external connection terminals are disposed in matrix on a lower surface side of the wiring board. BGA and LGA are mounted on mounting boards having terminals compatible thereto. When BGA or LGA is applied in place of TSOP, BGA or LGA is preferably designed so as to be mountable on an existing TSOP mounting board in view of general versatility. For this purpose, the arrangement of the external connection terminals of BGA or LGA has to be the same as the arrangement of the outer leads of TSOP.

In BGA or LGA, arranging the external connection terminals along two opposite outer sides of a wiring board similarly to the outer leads of TSOP unavoidably necessitates narrowing the pitch of the external connection terminals and thus involves a possibility of the occurrence of various problems. The use of the external connection terminals of conventional BGA or LGA as they are involves a concern about deterioration in mounting reliability. If the external connection terminals of BGA or LGA are formed at about the same pitch as the lead pitch of TSOP so that BGA or LGA is TSOP-compatible, the narrowed pitch of the terminals gives rise to various problems.

JP-A 2000-082757(KOKAI), JP-A 2003-332497(KOKAI), and JP-A2006-294656(KOKAI) describe that connection terminals disposed at corners are made larger than connection terminals disposed in an inner area in order to enhance mounting reliability of BGA. In all of these techniques, it is premised that the connection terminals (BGA terminals) are arranged in matrix, and there is no idea of arranging the connection terminals along two opposite sides of a wiring board. Nor is there any idea of forming the connection terminals at about the same pitch as the lead pitch of TSOP.

SUMMARY OF THE INVENTION

A semiconductor device according to an aspect of the present invention includes: a rectangular wiring board having a first surface with external connection terminals and a second surface with internal connection terminals; a semiconductor chip, mounted on the second surface of the wiring board, having electrode pads arranged along at least one outer side of the semiconductor chip; connecting members electrically connecting the electrode pads of the semiconductor chip and the internal connection terminals of the wiring board; and a sealing resin layer provided on the second surface of the wiring board to seal the semiconductor chip together with the connecting members, wherein the external connection terminals are arranged along two opposite outer sides of the wiring board and each have a rectangular shape elongated in a direction toward the outer side.

A semiconductor device according to another aspect of the present invention includes: a rectangular wiring board having a first surface with external connection terminals and a second surface with internal connection terminals; projecting terminals formed on the external connection terminals; a semiconductor chip, mounted on the second surface of the wiring board, having electrode pads arranged along at least one outer side of the semiconductor chip; connecting members electrically connecting the electrode pads of the semiconductor chip and the internal connection terminals of the wiring board; and a sealing resin layer provided on the second surface of the wiring board to seal the semiconductor chip together with the connecting members, wherein the external connection terminals are arranged along two opposite outer sides of the wiring board and each have a rectangular shape elongated in a direction toward the outer side.

A semiconductor device according to still another aspect of the present invention includes: a rectangular wiring board having a first surface with external connection terminals and a second surface with internal connection terminals; a semiconductor chip group including a plurality of semiconductor chips stacked on the second surface of the wiring board, each of the plural semiconductor chips having electrode pads arranged along at least one outer side of the semiconductor chip; connecting members electrically connecting the electrode pads of the plural semiconductor chips and the internal connection terminals of the wiring board; and a sealing resin layer provided on the second surface of the wiring board to seal the semiconductor chip group together with the connecting members, wherein the external connection terminals are arranged along two opposite outer sides of the wiring board and each have a rectangular shape elongated in a direction toward the outer side.

BRIEF DESCRIPTION OF THE DRAWINGS

FIG. 8 is a chart of a Weibull-plotted relation between the number of cycles and a failure rate in TCT of a semiconductor device (BGA package) solder-mounted on a TSOP board.

DETAILED DESCRIPTION OF THE INVENTION

Figure 1:
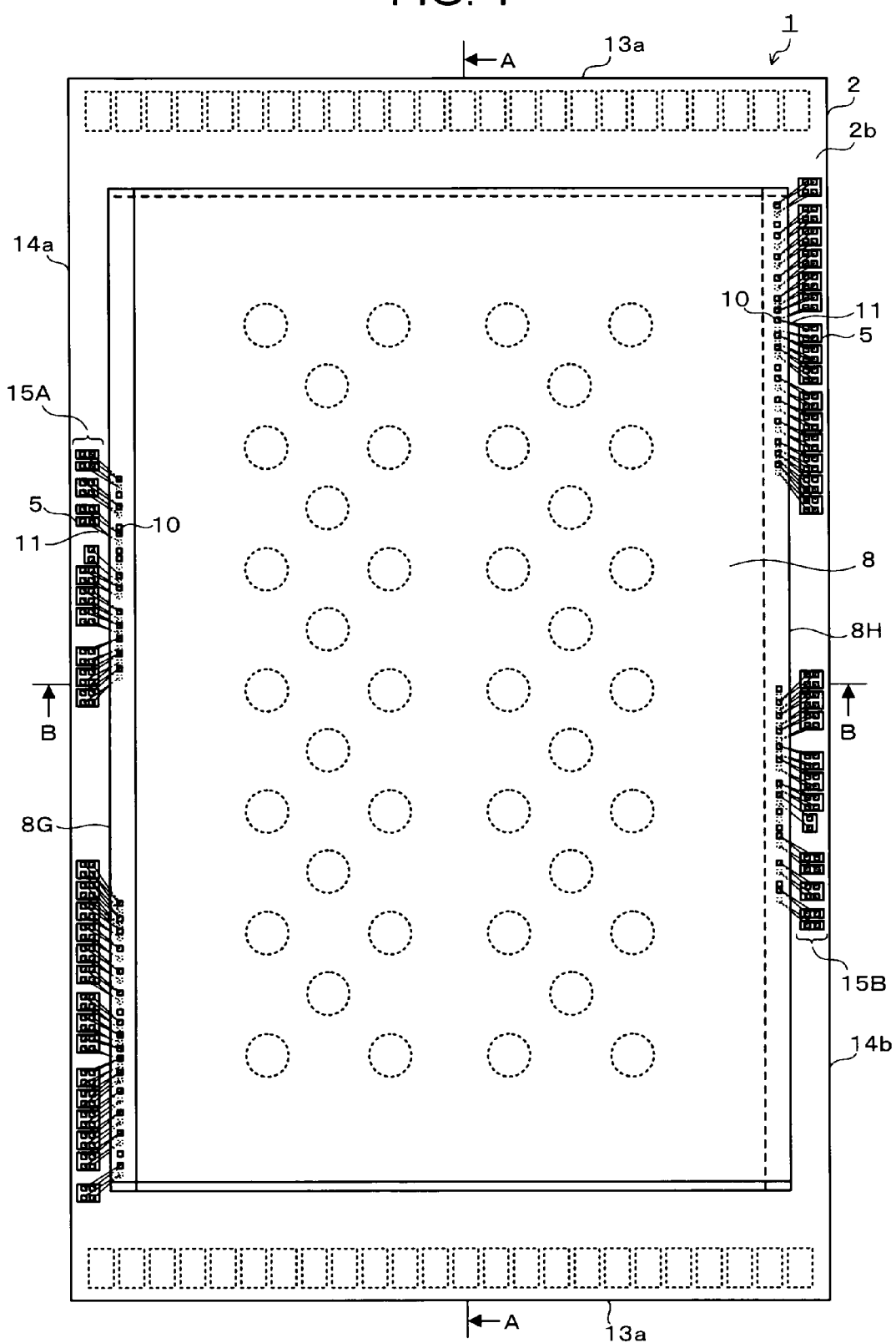
FIG. 1 is a plane view showing a semiconductor device according to an embodiment of the present invention.
Figure 2:
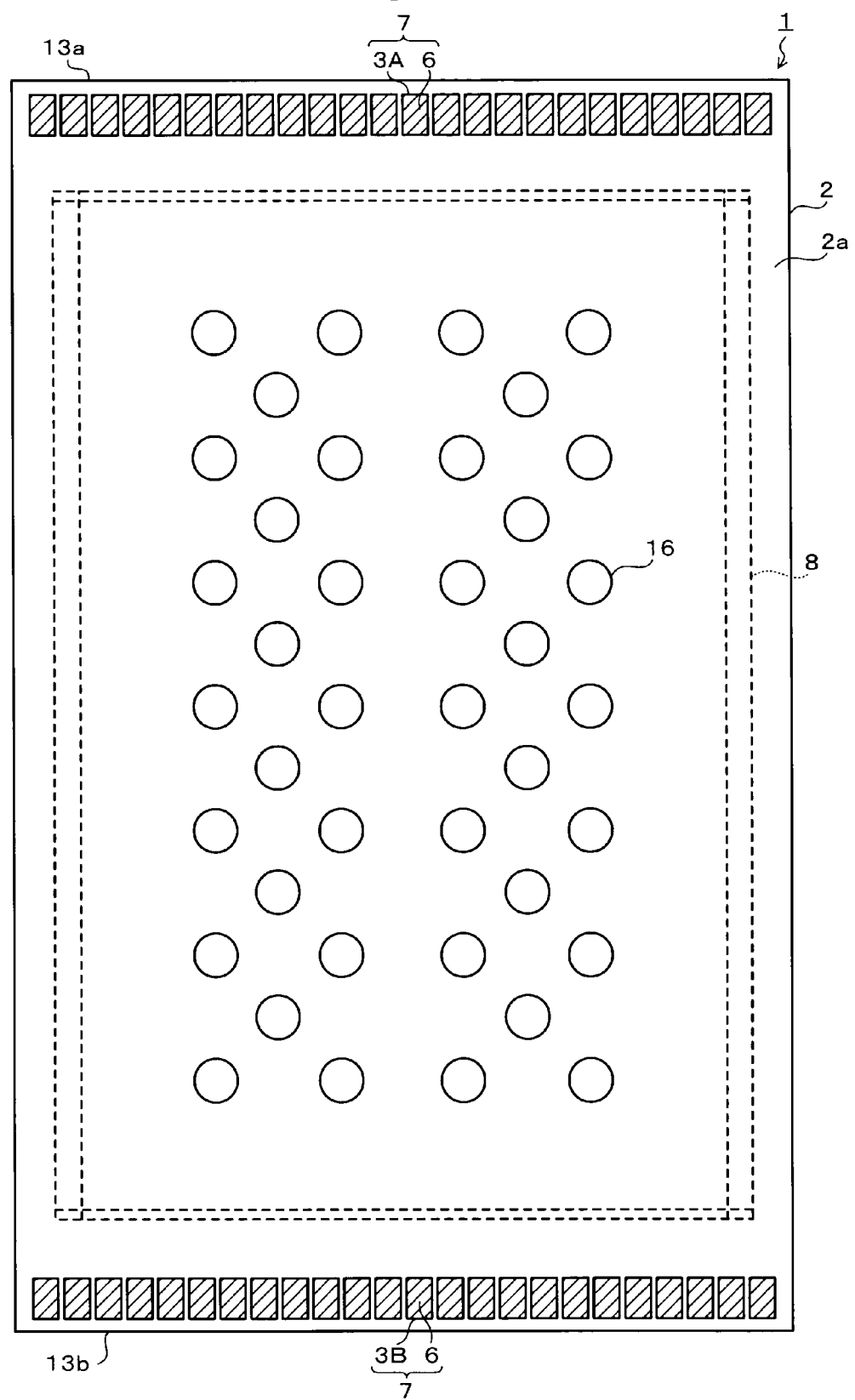
FIG. 2 is a bottom view of the semiconductor device shown in FIG. 1.
Figure 3:
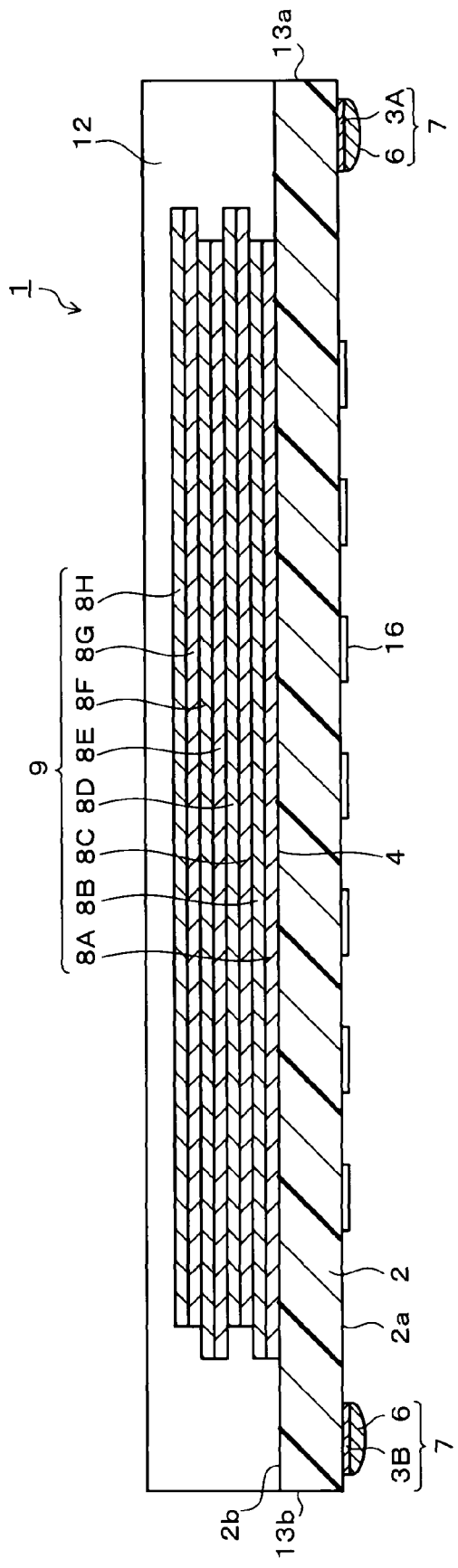
FIG. 3 is a cross-sectional view taken along the A-A line in FIG. 1.
Figure 4:
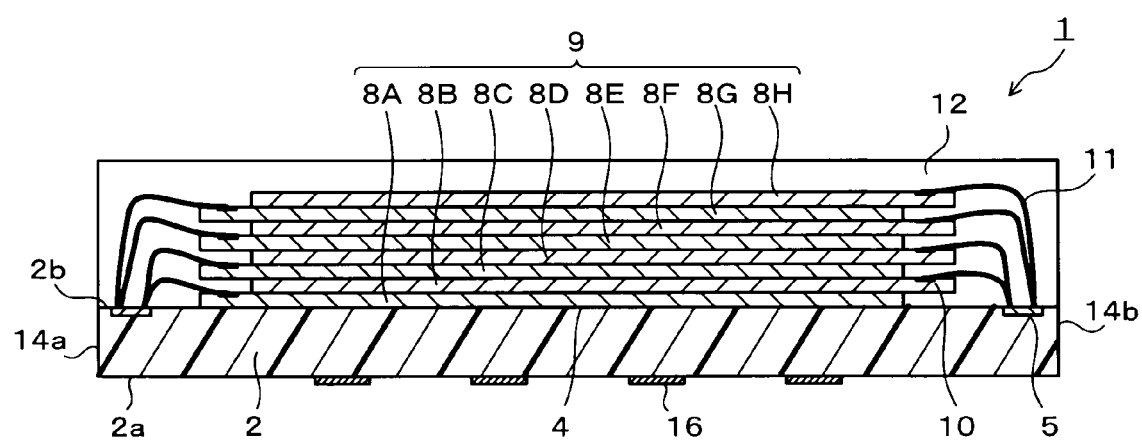
FIG. 4 is a cross-sectional view taken along the B-B line in FIG. 1.

An embodiment for carrying out the present invention will be hereinafter described with reference to the drawings. FIG. 1 to FIG. 4 show the structure of a semiconductor device (semiconductor package) according to an embodiment of the present invention. FIG. 1 is a plane view of the semiconductor device. FIG. 2 is a bottom view of the semiconductor device. FIG. 3 is a cross-sectional view taken along the A-A line in FIG. 1 (cross-sectional view taken along a longer side direction of a wiring board). FIG. 4 is a cross-sectional view taken along the B-B line in FIG. 1 (cross-sectional view taken along a shorter side direction of the wiring board).

In an attempt to, for example, make external connection terminals of a BGA package or a LGA package TSOP-compatible, the semiconductor device 1 is designed to solve a problem caused by the narrowed pitch of the external connection terminals. Specifically, it has been found out that, when the external connection terminals of the BGA package or the LGA package having the conventional terminal shape are arranged along two opposite outer sides of a wiring board similarly to outer leads of TSOP, mounting reliability of a semiconductor device on a mounting board is lowered because of an insufficient joint area between the external connection terminals and terminals of the mounting board.

It has been found out that, especially when a thermal cycling test (TCT) for the evaluation of mounting reliability is conducted, connection parts (for example, solder connection parts) between the external connection terminals of the semiconductor device and the terminals of the mounting board are likely to suffer defects such as crack and breakage due to a thermal stress applied in a direction in which the terminal arrangement sides (two outer sides) face each other. The semiconductor device 1 of this embodiment is designed to prevent the problem such as the deterioration in mounting reliability caused by the aforesaid narrowing of the pitch of the external connection terminals. Hereinafter, a concrete structure of the semiconductor device 1 will be described.

The semiconductor device 1 has a wiring board 2 as a chip-mounting base. The wiring board 2 is, for example, an insulating resin substrate in which and on whose surface a wiring network (not shown) is provided. A possible concrete example of the wiring board 2 is a printed wiring board with a multilayer structure using a resin substrate made of glass-epoxy resin or BT resin (Bsmaleimide-Triazine resin). The wiring board 2 has a first surface 2a on a lower surface side as an external connection surface (mounted surface) and a second surface 2b on an upper surface side as a chip mounting surface. The wiring board 2 has a rectangular contour.

External connection terminals 3 (3A, 3B) are provided on the first surface 2a of the wiring board 2. The external connection terminals 3 each include a metal layer (land) such as a Cu layer formed on the first surface 2a of the wiring board 2. On the second surface 2b of the wiring board 2, a chip mounting area 4 and internal connection terminals 5 are provided. The internal connection terminals 5 function as connection parts (connection pads) when the wiring board 2 and semiconductor chips are connected (for example, at the time of wire bonding). The internal connection terminals 5 are electrically connected to the external connection terminals 3 via the not-shown wiring network of the wiring board 2.

When the semiconductor device 1 is used as a BGA package, metal balls such as solder balls are disposed on the external connection terminals 3. By solder reflow of the solder balls disposed on the external connection terminals 3, solder bumps 6 are formed which have a shape spreading along the external connection terminals 3 while maintaining a shape projecting from the external connection terminals 3 as shown in FIG. 3. The initial ball volume of each of the solder bumps 6 is appropriately set based on the area of the external connection terminal 3, whereby the solder bumps 6 function as projecting terminals. The solder balls 6 each have a contour corresponding to the contour of the external connection terminals 3 in the rectangular shape and also have a height large enough to function as the projecting terminals.

The external connection terminals 3 and the solder bumps 6 form BGA external terminals 7. When the semiconductor device 1 is used as a BGA package, the solder bumps 6 function as connection parts connected to the mounting board. The land-shaped external connection terminals 3 function as support parts of the solder balls 6. The semiconductor device 1 of this embodiment is applicable to a LGA package as well. Without the solder bumps 6, the semiconductor device 1 is usable as a LGA package. When the semiconductor device 1 is used as a LGA package, the external connection terminals 3 directly function as metal lands (connection parts).

A plurality of semiconductor chips 8 (8A to 8H) are stacked on the chip mounting area 4 of the wiring board 2. The semiconductor chips 8A to 8H form a semiconductor chip group 9. The semiconductor chips 8 each have electrode pads 10 arranged along one side (concretely, one longer side) of its contour. The electrode pads 10 of the semiconductor chips 8 are electrically connected to the internal connection terminals (connection pads) 5 of the wiring board 2 via connecting members such as metal wires 11. A possible concrete example of each of the semiconductor chips 8 is a semiconductor memory chip (memory device) such as a NAND flash memory. On a stack of the semiconductor memory chips, a semiconductor chip such as a controller chip (controller device) is disposed when necessary.

On the second surface 2b of the wiring board 2 on which the plural semiconductor chips 8 are mounted, a sealing resin layer 12 made of, for example, epoxy resin is formed by molding. The sealing resin layer 12 integrally seals the plural semiconductor chips 8 together with the connecting members such as the metal wires 11. These constituent elements form the semiconductor device 1 used as a BGA package (or a LGA package). The semiconductor device 1 of this embodiment is suitable as a semiconductor memory device whose capacity is increased by stacking semiconductor memory chips such as NAND flash memories in multi layers. The semiconductor device 1 is not limited to this.

In the semiconductor device 1 of this embodiment, in order for the BGA external terminals 7 composed of the external connection terminals 3 and the solder bumps 6 to be compatible with outer leads of TSOP, the external connection terminals 3 are arranged along two opposite outer sides of the wiring board 2, concretely, two shorter sides (terminal arrangement sides) 13a, 13b. The semiconductor device 1 includes the external connection terminals 3A arranged along the shorter side 13a of the wiring board 2 and the external connection terminals 3B arranged along the other shorter side 13b.

Further, the signal arrangement of the BGA external terminals 7 is the same as the signal arrangement of the outer leads of TSOP. Therefore, the semiconductor device 1 forming the BGA package is mountable as it is on a TSOP mounting board (printed wiring board or the like). The semiconductor device 1 is used as BGA mountable on the TSOP board. In other words, the semiconductor device 1 is usable as a BGA package compatible with TSOP in terms of mounting. This also applies to a case where the semiconductor device 1 is used as a LGA package.

Figure 5A:
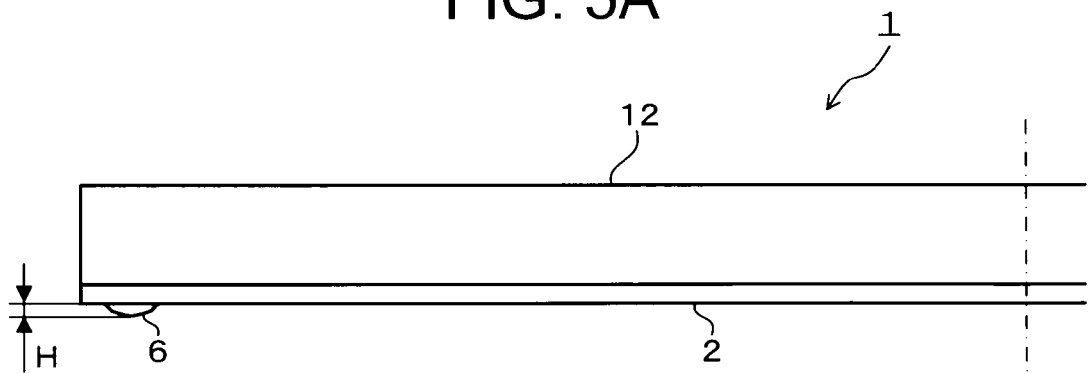
FIG. 5A and FIG. 5B are views showing the shape of external connection terminals of the semiconductor device.
Figure 5B:
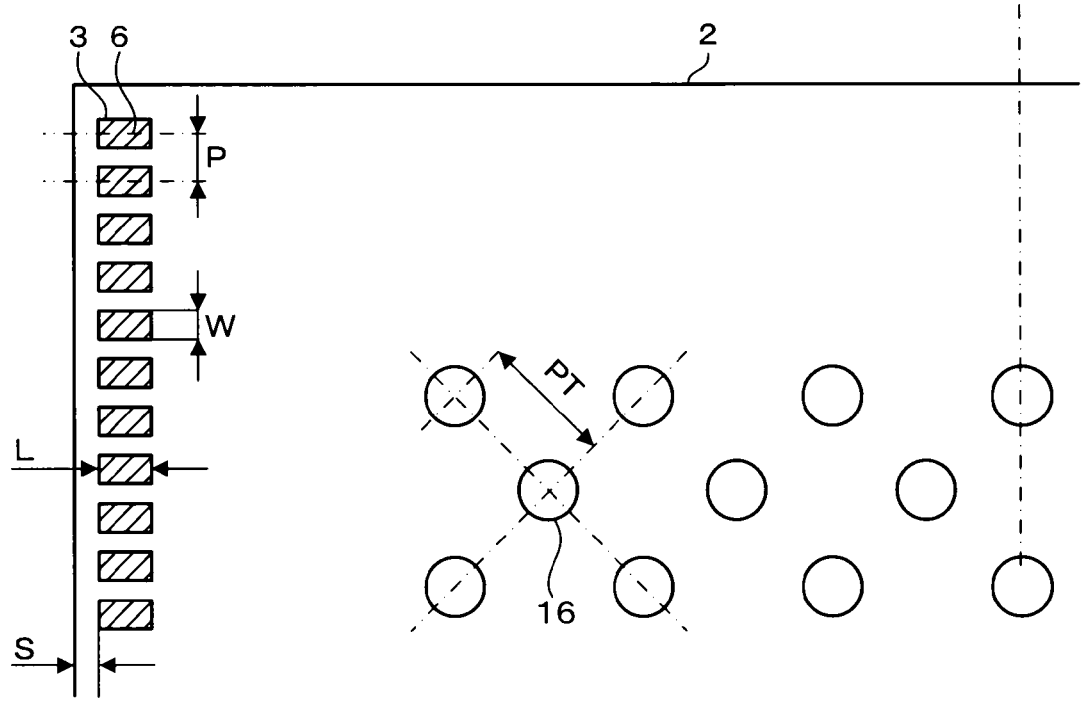

To connect the BGA external terminals 7 to terminals of the TSOP board, the formation pitch of the external terminals 7 (in particular, the external connection terminals 3) needs to be equal to the formation pitch of the outer leads of TSOP. As shown in FIG. 5A and FIG. 5B, a formation pitch (distance between center lines of the adjacent external connection terminals 3) P of the external connection terminals 3 is smaller than the customary formation pitch of the terminals of the BGA package, and is narrowed to, for example, 0.5 mm. When the external connection terminals 3 are formed at a narrow pitch, a length W of each of the external connection terminals 3 in terms of their arrangement direction is preferably 0.6 P or less (for example, 0.3 mm or less) in order to prevent a short circuit between the adjacent external terminals 7.

Figure 6:
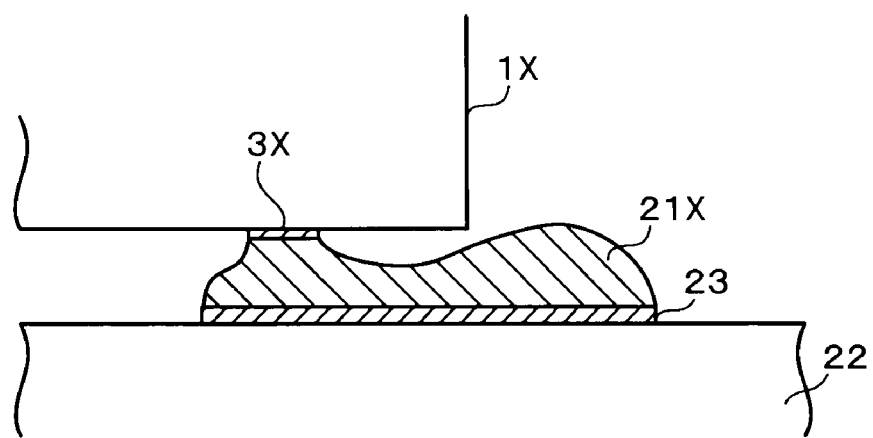
FIG. 6 is a cross-sectional view showing the shape of a solder connection part when a semiconductor device (BGA package) having conventional terminals is mounted on a board.

When the metal lands disposed at the 0.5 mm formation pitch P each have a circular shape with a 0.3 mm diameter or a square shape with a 0.3 width, a joint area, after the mounting, between a solder connection part 21X made of the solder bump 6 and an external connection terminal 3X is insufficient, as shown in FIG. 6. In FIG. 6, reference numeral 22 denotes a mounting board and reference numeral 23 denotes a terminal of the mounting board 22. Further, due to the insufficient joint area between the solder connection part 21X and the external connection terminal 3X, a semiconductor device 1X-side of the solder connection part 21X comes to have a sharply constricted shape. Because of these reasons, the solder connection part 21X is likely to suffer defects such as crack and breakage at low cycles when TCT is conducted. This means that mounting reliability of the semiconductor device (BGA package) 1X is low.

In the semiconductor device 1 of this embodiment, the external connection terminals 3A, 3B arranged along the two shorter sides 13a, 13b of the wiring board 2 have a rectangular shape elongated in a direction toward the shorter sides 13a, 13b respectively. The arrangement-direction length W (length of the shorter side) of each of the external connection terminals 3 is preferably 0.6 P or less relative to the terminal formation pitch P. It is difficult to make the length W of the shorter side longer. Therefore, in the semiconductor device 1, to increase the area of the external connection terminals 3, the length L of each of the external connection terminals 3A, 3B in terms of a direction perpendicular to the arrangement direction is elongated toward the shorter sides (terminal arrangement sides) 13a, 13b.

Figure 7:
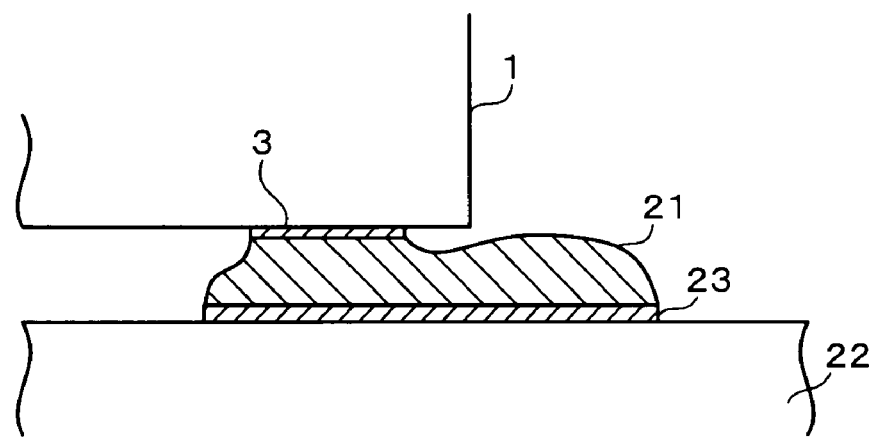
FIG. 7 is a cross-sectional view showing the shape of a solder connection part when the semiconductor device (BGA package) shown in FIG. 1 is mounted on the board.

Each of the external connection terminals 3 has a rectangular shape elongated in the direction toward the terminal arrangement side 13 and thus has an increased area, which realizes an increased joint area between the external connection terminal 3 and the solder connection part 21 as shown in FIG. 7. A cross-sectional shape of the solder connection part 21 (a cross-sectional shape taken along a plane direction of the wiring board 2) is an elliptic shape close to a rectangle. The increase in joint area between the solder connection part 21 and the external connection terminal 3 results in a gentler constriction of the semiconductor device 1 side of the solder connection part 21. For these reasons, it is possible to improve mounting reliability of the semiconductor device 1 on the mounting board 22. Concretely, in a thermal cycling test (TCT) for the evaluation of mounting reliability of the semiconductor device 1 on the mounting board 22, it is possible to prevent the solder connection part 21 from suffering crack, breakage, and the like at low cycles.

Incidentally, for enhanced mounting reliability of an electronic component having projecting terminals made of solder bumps or the like, an underfill material is filled in a gap between the electronic component and a mounting device (mounting board or the like). However, when the solder bumps 6 are disposed in an unbalanced manner on the first surface 2a of the wiring board 2 as in the semiconductor device 1 of this embodiment, the underfill material is not capable of fully exhibiting its effect. Further, the underfill material also has a drawback of exhibiting an insufficient effect in the thermal cycling test and of poor reworkability.

Regarding these problems, the semiconductor device 1 having the external connection terminals 3 in the rectangular shape exhibits a favorable effect when the semiconductor device 1 mounted on the mounting board is subjected to the thermal cycling test, and further has a characteristic requiring no consideration of reworkability. Therefore, it is possible to improve mounting reliability and handlability of the semiconductor device 1. This does not necessarily exclude the application of the underfill material. The underfill material may be filled between the semiconductor device 1 and the mounting board when necessary.

FIG. 8 shows the results obtained when the semiconductor device 1 mounted on the mounting board is subjected to TCT. In FIG. 8, an example 1 is a BGA package (semiconductor device 1) in which the external connection terminals 3 with the terminal formation pitch P=0.5 mm, the length L of the longer side=0.55 mm, and the length W of the shorter side=0.3 mm are used and solder bumps (solder balls after subjected to the reflow) 6 are formed thereon with a 0.13 mm height. In the example 1, no underfill material is used. An example 2 is the BGA package of the example 1 with the underfill material used. A comparative example 1 is a BGA package in which circular external connection terminals with the terminal formation pitch P=0.5 mm and the diameter=0.3 mm are used and solder bumps are formed thereon with a 0.13 mm height. A comparative example 2 is the BGA package of the comparative example 1 with the underfill material used.

The BGA packages according to the examples 1 and 2 and the comparative examples 1 and 2 were each subjected to TCT after solder-mounted on a TSOP mounting board (pad shape: 0.3×1.6 mm). In conducting TCT, one cycle was set to −25° C. to 125° C. FIG. 8 shows a Weibull-plotted relation between the number of cycles and an occurrence rate of failures (failure rate) when such thermal cycling is applied. As is apparent from FIG. 8, it is seen that, in the comparative example 1 using the circular terminals, failures occur at low cycles. It is seen that failures occur even at low cycles in the comparative example 2, which means poor mounting reliability. On the other hand, it is seen that, in the examples 1, 2, the occurrence of failures shifts toward a high cycle side and their inclinations of the plots are large, which means excellent mounting reliability.

In the semiconductor device 1 of this embodiment, setting the length L of the longer side of the external connection terminal 3 having the rectangular shape longer than the length W of its shorter side can produce the effect of increasing the area of the external connection terminal 3. For more effective increase in the terminal area, the length L of the longer side is more preferably 1.5 W or more. However, setting the length L of the longer side too long necessitates increasing the size of the solder ball (the size of the solder ball not yet subjected to the reflow) so as to make its height H large enough for the mounting. Since the formation pitch of the external connection terminals 3 is narrow, a large solder ball, when subjected to the reflow, might possibly come into contact with the adjacent external connection terminals 3 to be short-circuited. Therefore, the length L of the longer side of the external connection terminal 3 is preferably 2 W or less.

The length W of the shorter side of the external connection terminal 3 is preferably 0.6 P or less. In view of securing the height H of the mountable solder bump 6, the length W of the shorter side is preferably 0.6 P or less. In order to obtain the effect of increasing the area of the external connection terminal 3, the length W of the shorter side is preferably 0.4 P or more. In the semiconductor device 1 used as a BGA package, the external connection terminal 3 preferably has a rectangular shape satisfying $0.4\,P \leqq W \leqq 0.6\,P$ and $W < L \leqq 2\,W$ (further, $1.5\,W \leqq L \leqq 2\,W$). Such a terminal shape is effective when the external connection terminals 3 are formed at a narrow pitch. Concretely, this is effective when the formation pitch P of the external connection terminals 3 is 0.8 mm or less, and further, 0.6 mm or less (for example, 0.5 mm).

Each of the external connection terminals 3 is preferably formed so that its distance S from the terminal arrangement side (outer side) 13 of the wiring board 2 is 0.2 mm or more. If the external connection terminals 3 and the outer sides 13 of the wiring board 2 are too close, a cutting failure or the like is likely to occur in the external connection terminals 3 and the solder bumps 6 when the wiring board 2 is cut. Since each of the external connection terminals 3 has the elongated rectangular shape, its distance from the terminal arrangement side (outer side) 13 of the wiring board 2 is likely to be short. Therefore, the distance S between the external connection terminal 3 and the terminal arrangement side (outer side) 13 of the wiring board 2 is preferably 0.2 mm or more.

Without the solder balls 6, the semiconductor device 1 of this embodiment is usable as a LGA package. As for the shape of the external connection terminals 3 when the semiconductor device 1 is applied to a LGA package, the length W of the shorter side of each of the external connection terminals 3 is preferably in a range of $0.4\,P \leqq W \leqq 0.6\,P$ similarly to that in the BGA package.

The LGA package is scarcely likely to suffer solder flow unlike the BGA package. The length L of the longer side of the external connection terminal 3 can be longer. Concretely, the length L of the longer side is preferably in a range of $W < L \leqq 3\,W$, more preferably, in a range of $1.5\,W \leqq L \leqq 2.5\,W$. Applying the external connection terminals 3 having such a shape enables the improvement in mounting reliability of the LGA package (semiconductor device 1).

Next, the stacked structure of the plural semiconductor chips 8 will be described. Here, a description will be given of a case where the eight semiconductor chips 8, for example, semiconductor memory chips such as NAND flash memories are stacked. The number of the mounted semiconductor chips 8 (the number of stacked layers) is not limited to eight but may be any provided that the number of the semiconductor chips 8 forming the semiconductor chip group 9 is plural. Depending on cases, the number of the semiconductor chips 8 may be one. The number of the mounted semiconductor chips 8 is not specifically limited, and may be one or may be plural. However, the semiconductor device 1 preferably includes the plural semiconductor chips (memory chips) 8.

The first to eighth semiconductor chips 8A to 8H have the same rectangular shape and each has the electrode pads 10 arranged along one longer side thereof. The first to eighth semiconductor chips 8A to 8H each have a one-longer-side pad structure. In correspondence to the semiconductor chips 8A to 8H, terminal formation areas 15A, 15B are provided along both longer sides 14a, 14b of the second surface 2b of the wiring board 2 respectively. The internal connection terminals 5 functioning as connection pads at the time of the wire bonding are disposed on the terminal formation areas 15A, 15B.

The first semiconductor chip 8A is bonded on the chip mounting area 4 of the wiring board 2 via a bonding layer (not shown) so that its electrode formation surface having the electrode pads 10 faces upward. As the bonding layer, used is an ordinary die attach film (adhesive film) whose major component is polyimide resin, epoxy resin, acrylic resin, or the like. This applies to bonding layers of the other semiconductor chips 8. The first semiconductor chip 8A is disposed with its pad arrangement side (longer side) facing the longer side 14a of the wiring board 2. That is, the first semiconductor chip 8A is disposed so that the electrode pads 10 arranged along its one longer side are positioned near the first terminal formation area 15A of the wiring board 2.

The second semiconductor chip 8B is bonded on the first semiconductor chip 8A via the bonding layer (not shown) so that its electrode formation surface having the electrode pads 10 faces upward and so that the electrode pads 10 of the first semiconductor chip 8A are exposed. The second semiconductor chip 8B is disposed with its pad arrangement side (longer side) facing the longer side 14b of the wiring board 2. That is, the second semiconductor chip 8B is disposed so that the electrode pads 10 arranged along its one longer side are positioned near the second terminal formation area 15B of the wiring board 2.

The third semiconductor chip 8C is bonded on the second semiconductor chip 8B via the bonding layer (not shown) in the same arrangement as that of the first semiconductor chip 8A. The fourth semiconductor chip 8D is bonded on the third semiconductor chip 8C via the bonding layer (not shown) in the same arrangement as that of the second semiconductor chip 8B. The fifth and seventh semiconductor chips 8E, 8G are stacked in the same arrangement as that of the first semiconductor chip 8A similarly to the third semiconductor chip 8C. The sixth and eighth semiconductor chips 8F, 8H are stacked in the same arrangement as that of the second semiconductor chip 8B similarly to the fourth semiconductor chip 8D.

The eight semiconductor chips 8A to 8H are disposed so that the longer sides where the electrode pads 10 are arranged (pad arrangement sides) are alternately positioned, and each of the semiconductor chips 8A to 8H is stacked to be deviated from the semiconductor chip 8 on its lower side in a direction in which the shorter side extends so that the electrode pads 10 of the lower-side semiconductor chip 8 are exposed. By such a stacked structure, it is possible to expose the electrode pads 10 of the eight semiconductor chips 8A to 8H and yet to prevent an increase in occupation area of the semiconductor chips 8 on the wiring board 2.

The first, third, fifth, and seventh semiconductor chips 8A, 8C, 8E, 8G are disposed so that the electrode pads 10 thereof are positioned near the first terminal formation area 15A. These electrode pads 10 are electrically connected via the metal wires 11 to the internal connection terminals (connection pads) 5 disposed on the first terminal formation area 15A. The second, fourth, sixth, and eighth semiconductor chips 8B, 8D, 8F, 8H are disposed so that the electrode pads 10 thereof are positioned near the second terminal formation area 15B. These electrode pads 10 are electrically connected via the metal wires 11 to the internal connection terminals 5 disposed on the second terminal formation area 15B. As the metal wires 11, ordinary Au wires or Cu wires are used.

The first, third, fifth, and seventh semiconductor chips 8A, 8C, 8E, 8G may be disposed in the same arrangement. In this case, however, there is a risk of interference between the metal wires 11 connected to the semiconductor chips 8 which are stacked close to each other, that is, between the metal wires 11 connected to the first semiconductor chip 8A and the third semiconductor chips 8C, between the metal wires 11 connected to the third semiconductor chip 8C and the fifth semiconductor chip 8E, and between the metal wires 11 connected to the fifth semiconductor chip 8E and the seventh semiconductor chip 8G.

In the semiconductor device 1 of this embodiment, the third semiconductor chip 8C is disposed to be deviated from the first semiconductor chip 8A in the direction in which the longer side extends. The fifth semiconductor chip 8E is disposed at the same position as the first semiconductor chip 8A. The seventh semiconductor chip 8G is disposed to be deviated from the fifth semiconductor chip 8E in the direction in which the longer side extends. The first semiconductor chip 8A and the fifth semiconductor chip 8E are in the same arrangement, and the second semiconductor chip 8B and the seventh semiconductor chip 8G are in the same arrangement.

The positions of the first semiconductor chip 8A and the third semiconductor chip 8C, and the fifth semiconductor chip 8E and the seventh semiconductor chip 8G, which are stacked close to each other, are deviated from each other in the direction in which the longer side extends (the arrangement direction of the electrode pads 10), which makes it possible to enhance connectability (wire bondability) of the metal wires 11 and reliability thereof (prevention of short-circuit due to the contact of the wires, and the like). The arrangement of the second, fourth, sixth, and eighth semiconductor chips 8B, 8D, 8F, 8H is also the same as the above arrangement. The fourth and eighth semiconductor chips 8D, 8H are arranged to be deviated from the second and sixth semiconductor chips 8B, 8F in the direction in which the longer side extends so that the electrode pads 10 are not aligned.

In the semiconductor device 1 of this embodiment, the plural semiconductor chips 8A to 8H are disposed so that the pad arrangement sides thereof are alternately positioned, and each of the semiconductor chips 8 is stacked to be deviated from the semiconductor chip 8 on its lower side in a direction perpendicular to the pad arrangement side so that the electrode pads 10 of the lower-side semiconductor chip 8 are exposed. Among the plural semiconductor chips 8 whose pad arrangement sides are disposed to face the same direction (the first, third, fifth, and seventh semiconductor chips 8A, 8C, 8E, 8G, or the second, fourth, sixth, and eighth semiconductor chips 8B, 8D, 8F, 8H), the semiconductor chips 8 which are stacked close to each other are disposed to be deviated from one another in the direction in which the pad arrangement side extends. Applying such a stacked structure makes it possible to prevent an increase in a chip occupation area and at the same time to favorably maintain wire-bondability to the semiconductor chips 8.

As in an ordinary BGA package or LGA package, in the semiconductor device 1 of this embodiment, the semiconductor chips 8 whose size is close to the package size are mountable. Since the external connection terminals (BGA terminals or LGA terminals) 3 of such a semiconductor device 1 are compatible with TSOP, it is possible to realize both the mounting of the semiconductor device 1 on a TSOP board and the mounting of the semiconductor chips 8 larger than a semiconductor device mountable on TSOP. The shape of the external connection terminals 3 contributes to improvement in mounting reliability of the semiconductor device 1 on the TSOP board.

Therefore, according to this embodiment, it is possible to provide a BGA package or a LGA package which realizes compatibility with TSOP, on one hand, and thus realizes versatility and an increase in chip area (higher capacity and the like) and, on the other, solves deterioration in mounting reliability owing to the terminal shape. The semiconductor device 1 has a larger capacity, versatility, and reliability. Such a semiconductor device 1 is suitable as, for example, a large-capacity semiconductor memory device that is difficult to realize by TSOP. Being TSOP-compatible, the semiconductor device 1 can realize an increase in memory capacity of a semiconductor memory device mounted on a TSOP board, wider varieties of products owing to the memory capacity of the semiconductor memory device, and so on.

Incidentally, to conduct electrical characteristic inspection of the semiconductor device 1, probes may be brought into contact with the external connection terminals 3 of the wiring board 2, but the narrow formation pitch P of the external connection terminals 3 may possibly make it difficult to conduct the electrical characteristic inspection. Therefore, the semiconductor device 1 of this embodiment has, on the first surface 2a of the wiring board 2, test terminals 16 which are provided separately from the external connection terminals 3. On the first surface 2a of the wiring board 2, the test terminals 16 are provided in an inner area except the formation area of the external connection terminals 3. A formation pitch PT of the test terminals 16 may be wider than the formation pitch P of the external connection terminals 3 (PT>P). This makes it possible to satisfactorily conduct the electrical characteristic inspection of the semiconductor device 1.

The test terminals 16 are electrodes with which the probes come into contact at the time of the electrical characteristic inspection and do not contribute to the connection to an external part. Wirings of the test terminals 16 may be branches extending from the middle of wirings from the internal connection terminals 5 electrically connected to the electrode pads 10 of the semiconductor chips 8 to the external connection terminals 3, but in this case, a wiring failure in portions ahead of the branch points cannot be detected. Therefore, the wirings preferably extend from the internal connection terminals 5 and pass through the external connection terminals 3 to reach the test terminals 16. The use of the wirings routed around from the internal connection terminals 5 to the test terminals 16 can ensure the detection of a failure of the semiconductor device 1 by the test terminals 16.

It should be noted that the semiconductor device of the present invention is not limited to the above-described embodiment, and the present invention is applicable to various kinds of semiconductor devices in which semiconductor chips are mounted on a wiring board having external connection terminals (BGA terminals, LGA terminals, or the like) compatible with TSOP. Various modifications may be made as a concrete structure of the semiconductor device of the present invention, provided that these modifications satisfy the basic structure of the present invention. Further, any expansion and modification may be made in the embodiment within a range of the technical idea of the present invention, and the expanded and modified embodiments are also included in the technical scope of the present invention.

What is claimed is:

1. A semiconductor device, comprising:
a rectangular wiring board having a first surface with external terminals and a second surface with internal connection terminals;
a semiconductor chip, mounted on the second surface of the wiring board, having electrode pads arranged along at least one outer side of the semiconductor chip;
connecting members electrically connecting the electrode pads of the semiconductor chip and the internal connection terminals of the wiring board; and
a sealing resin layer provided on the second surface of the wiring board to seal the semiconductor chip together with the connecting members,
wherein the external connection terminals are arranged along two opposite outer sides of the wiring board and each have a rectangular shape elongated in a direction toward the outer side,
wherein the external connection terminals each have the rectangular shape satisfying conditions of $0.4\,P \leq W \leq 0.6\,P$ and $W < L \leq 2\,W$, where P is a formation pitch of the external connection terminals, W is a length of a shorter side of the external connection terminal, and L is a length of a longer side of the external connection terminal.

2. The semiconductor device according to claim 1,
wherein the external connection terminals are arranged along two shorter sides of the wiring board.

3. The semiconductor device according to claim 1,
wherein the external connection terminals include BGA terminals or LGA terminals.

4. The semiconductor device according to claim 1, further comprising:
test terminals provided on an inner area of the first surface of the wiring board except an area in which the external connection terminals are formed.

5. A semiconductor device, comprising:
a rectangular wiring board having a first surface with external connection terminals and a second surface with internal connection terminals;
projecting terminals formed on the external connection terminals;
a semiconductor chip, mounted on the second surface of the wiring board, having electrode pads arranged along at least one outer side of the semiconductor chip;
connecting members electrically connecting the electrode pads of the semiconductor chip and the internal connection terminals of the wiring board; and
a sealing resin layer provided on the second surface of the wiring board to seal the semiconductor chip together with the connecting members,
wherein the external connection terminals are arranged along two opposite outer sides of the wiring board and each have a rectangular shape elongated in a direction toward the outer side,
wherein the external connection terminals each have the rectangular shape satisfying conditions of $0.4\,P \leq W \leq 0.6\,P$ and $W < L \leq 2\,W$, where P is a formation pitch of the external connection terminals, W is a length of a shorter side of the external connection terminal, and L is a length of a longer side of the external connection terminal.

6. The semiconductor device according to claim 5,
wherein the external connection terminals are arranged along two shorter sides of the wiring board.

7. The semiconductor device according to claim 5,
wherein the external connection terminals include metal lands and the projecting terminals include solder bumps.

8. The semiconductor device according to claim 5, further comprising:
test terminals provided on an inner area of the first surface of the wiring board except an area in which the external connection terminals are formed.

9. A semiconductor device, comprising:
a rectangular wiring board having a first surface with external connection terminals and a second surface with internal connection terminals;
a semiconductor chip group including a plurality of semiconductor chips stacked on the second surface of the wiring board, each of the plural semiconductor chips having electrode pads arranged along at least one outer side of the semiconductor chip;
connecting members electrically connecting the electrode pads of the semiconductor chips and the internal connection terminals of the wiring board; and
a sealing resin layer provided on the second surface of the wiring board to seal the semiconductor chip group together with the connecting members,
wherein the external connection terminals are arranged along two opposite outer sides of the wiring board and each have a rectangular shape elongated in a direction toward the outer side,
wherein the external connection terminals each have the rectangular shape satisfying conditions of $0.4\,P \leq W \leq 0.6\,P$ and $W < L \leq 2\,W$, where P is a formation pitch of the external connection terminals, W is a length of a shorter side of the external connection terminal, and L is a length of a longer side of the external connection terminal.

10. The semiconductor device according to claim 9,
wherein the external connection terminals are arranged along two shorter sides of the wiring board.

11. The semiconductor device according to claim 10,
wherein the electrode pads are arranged along a longer side of the semiconductor chip and are electrically connected to the internal connection terminals via metal wires as the connecting members.

12. The semiconductor device according to claim 11,
wherein the wiring board includes first internal connection terminals arranged along a first longer side and second internal connection terminals arranged along a second longer side; and
wherein the plural semiconductor chips include a first semiconductor chip which is disposed with the electrode pads being positioned near the first internal connection terminals, and a second semiconductor chip which is disposed with the electrode pads being positioned near the second internal connection terminals.

13. The semiconductor device according to claim 11,
wherein the wiring board includes first internal connection terminals arranged along a first longer side and second internal connection terminals arranged along a second longer side;
wherein the plural semiconductor chips include a plurality of first semiconductor chips which is disposed with the electrode pads being positioned near the first internal connection terminals, and a plurality of second semiconductor chips which is disposed with the electrode pads being positioned near the second internal connection terminals; and
wherein the first semiconductor chips and the second semiconductor chips are alternately stacked to be deviated from one another in a direction in which the shorter side extends, so as to have the electrode pads exposed.

14. The semiconductor device according to claim 13, wherein the plural first semiconductor chips are disposed to be deviated from one another in a direction in which the longer side extends, and the plural second semiconductor chips are disposed to be deviated from one another in the direction in which the longer side extends.

15. The semiconductor device according to claim 9, wherein the external connection terminals include BGA terminals or LGA terminals.

16. The semiconductor device according to claim 9, further comprising:
   projecting terminals including solder bumps formed on the external connection terminals.

17. The semiconductor device according to claim 9, further comprising:
   test terminals provided on an inner area of the first surface of the wiring board except an area in which the external connection terminals are formed.

* * * * *